United States Patent
Menard et al.

(10) Patent No.: US 9,722,061 B2
(45) Date of Patent: Aug. 1, 2017

(54) BIDIRECTIONAL SWITCH

(71) Applicant: STMicroelectronics (Tours) SAS, Tours (FR)

(72) Inventors: Samuel Menard, Tours (FR); Dalaf Ali, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 14/731,563

(22) Filed: Jun. 5, 2015

(65) Prior Publication Data

US 2016/0027907 A1    Jan. 28, 2016

(30) Foreign Application Priority Data

Jul. 24, 2014 (FR) ................................. 14 57142

(51) Int. Cl.
*H01L 29/66* (2006.01)
*H01L 29/747* (2006.01)
*H01L 29/06* (2006.01)

(52) U.S. Cl.
CPC ........ *H01L 29/747* (2013.01); *H01L 29/0638* (2013.01)

(58) Field of Classification Search
CPC ................... H01L 29/747; H01L 29/0638
USPC ............................................. 257/119
See application file for complete search history.

(56) References Cited

U.S. PATENT DOCUMENTS

| | | | |
|---|---|---|---|
| 5,883,401 A | | 3/1999 | Pezzani |
| 5,998,813 A | * | 12/1999 | Bernier ............... H01L 27/0248 257/126 |
| 6,034,381 A | | 3/2000 | Pezzani |
| 6,049,096 A | * | 4/2000 | Bernier ............... H01L 27/0248 257/154 |
| 6,323,718 B1 | * | 11/2001 | Rault ................... H01L 27/0641 257/E27.018 |
| 6,380,565 B1 | | 4/2002 | Duclos et al. |

(Continued)

FOREIGN PATENT DOCUMENTS

| | | |
|---|---|---|
| EP | 1076366 A1 | 2/2001 |
| EP | 1324394 A1 | 7/2003 |

(Continued)

OTHER PUBLICATIONS

INPI Search Report and Written Opinion for FR 1457142 dated Dec. 10, 2014 (8 pages).

*Primary Examiner* — Vongsavanh Sengdara

(74) *Attorney, Agent, or Firm* — Gardere Wynne Sewell LLP

(57) ABSTRACT

A bidirectional switch is formed in a semiconductor substrate of a first conductivity type. The switch includes first and second thyristors connected in antiparallel extending vertically between front and rear surfaces of the substrate. A vertical peripheral wall of the second conductivity type connects the front surface to the rear surface and surrounds the thyristors. On the front surface, in a ring-shaped region of the substrate separating the vertical peripheral wall from the thyristors, a first region of the first conductivity type is provided having a doping level greater than the substrate and having the shape of a ring-shaped band portion partially surrounding the first thyristor and stopping at the level of the adjacent region between the first and second thyristors.

20 Claims, 2 Drawing Sheets

(56) References Cited

U.S. PATENT DOCUMENTS

| | | | |
|---|---|---|---|
| 6,593,600 B1 | 7/2003 | Duclos et al. | |
| 6,818,927 B2 | 11/2004 | Simonnet | |
| 2002/0008247 A1* | 1/2002 | Galtie | H01L 21/761 257/119 |
| 2003/0122211 A1 | 7/2003 | Ladiray | |
| 2004/0026711 A1 | 2/2004 | Gimonet et al. | |
| 2004/0135170 A1* | 7/2004 | Menard | H01L 29/747 257/119 |
| 2005/0017263 A1* | 1/2005 | Simmonet | H01L 27/0817 257/119 |
| 2005/0245006 A1 | 11/2005 | Tseng | |
| 2006/0125055 A1* | 6/2006 | Menard | H01L 29/7404 257/607 |
| 2011/0284921 A1* | 11/2011 | Menard | H01L 29/1012 257/119 |
| 2013/0049065 A1* | 2/2013 | Menard | H01L 29/747 257/124 |
| 2014/0110751 A1 | 4/2014 | Chang et al. | |

FOREIGN PATENT DOCUMENTS

| | | |
|---|---|---|
| EP | 1672699 A1 | 6/2006 |
| FR | 2664741 A1 | 1/1992 |
| FR | 2895600 A1 | 6/2007 |
| WO | WO-0250915 A1 | 6/2002 |
| WO | WO-2011135242 A1 | 11/2011 |

\* cited by examiner

BIDIRECTIONAL SWITCH

PRIORITY CLAIM

This application claims the priority benefit of French Patent application number 1457142, filed on Jul. 24, 2014, the contents of which is hereby incorporated by reference in its entirety to the maximum extent allowable by law.

TECHNICAL FIELD

The present disclosure generally relates to electronic components, and more particularly aims at the forming of a monolithic bidirectional switch inside and on top of a semiconductor substrate.

BACKGROUND

The most conventional bidirectional switches are triacs. A triac corresponds to the antiparallel association of two thyristors. It may be directly connected in an alternating current (A.C.) network, for example, the mains. The gate of a conventional triac corresponds to the cathode gate of one at least of the two thyristors forming it and is referenced to the main electrode (or power conduction electrode) located on the front surface of this triac, that is, the surface which comprises the gate electrode, the main electrode (or power conduction electrode) located on the other surface of the triac, or rear surface, receiving the power signal.

Bidirectional switches of the type described in U.S. Pat. Nos. 6,034,381, 6,593,600, 6,380,565 and 6,818,927 (incorporated by reference), which are turned on by application of a voltage between a gate electrode located on the front surface of the component and a main electrode located on the opposite surface or rear surface of the component, will be more particularly considered hereafter.

FIG. 1 shows an equivalent electric diagram of such a bidirectional switch. A switch control electrode G is connected to the emitter of a bipolar transistor T having its collector connected to the anode gates of first and second thyristors Th1 and Th2 placed in antiparallel between two main electrodes A1 and A2. Electrode A1 is connected to the anode of thyristor Th1 and to the cathode of thyristor Th2. Electrode A1 is also connected to the base of transistor T. Electrode A2 is connected to the anode of thyristor Th2 and to the cathode of thyristor Th1.

SUMMARY

An embodiment provides a bidirectional switch formed in a semiconductor substrate of a first conductivity type comprising a front surface and a rear surface, comprising: first and second adjacent thyristors in antiparallel extending vertically between the front surface and the rear surface of the substrate; a vertical peripheral wall of the second conductivity type connecting the front surface of the substrate to its rear surface and surrounding said thyristors; and on the front surface side, in a ring-shaped region of the substrate separating the wall from the thyristors, a first region of the first conductivity type, having a greater doping level than the substrate, the first region having the shape of a ring-shaped band portion partially surrounding the first thyristor and stopping at the level of the adjacent region between the first and second thyristors.

According to an embodiment, the switch further comprises a second region of the first conductivity type formed in a first well of the second conductivity type connected to said wall, the second region forming the gate of the switch and being more remote from the second thyristor than from the first thyristor.

According to an embodiment, the second region is located on a side of the first thyristor opposite to the second thyristor.

According to an embodiment, a portion of the first region is located between the second region and the first thyristor.

According to an embodiment, the first well and the vertical wall are contiguous.

According to an embodiment, the first region is coated with a metallization which is not connected to an external terminal of the switch.

According to an embodiment, the switch further comprises, on the front surface side, in said ring-shaped region of the substrate, a third region of the first conductivity type, having a doping level greater than that of the substrate, the third region having the shape of a portion of a ring-shaped band partially surrounding the second thyristor and stopping at the level of the adjacent region between the first and second thyristors, and the third and first regions being separate.

According to an embodiment, the third region is coated with a metallization which is not connected to an external terminal of the switch and not connected to the first region.

According to an embodiment, the switch comprises: on the rear surface side, a layer of the second conductivity type and a fourth region of the first conductivity type formed in said layer and extending over a first portion of the surface of the switch, said layer being connected to the front surface by the wall at the periphery of the switch; on the front surface side, a second well of the second conductivity type separated from the wall by said ring-shaped region of the substrate, and a fifth region of the first conductivity type formed in the second well and extending over a second portion of the surface of the switch substantially complementary to the first portion, the ends of the first region being located, in top view, substantially at the same distance from the fourth region as from the fifth region.

According to an embodiment, the switch further comprises a first metallization coating the rear surface of the fourth region and the rear surface of said layer, and a second metallization coating the front surface of the fifth region and the front surface of the second well.

According to an embodiment, the first and second conductivity types respectively are type N and type P.

According to an embodiment, the first region is U-shaped or C-shaped.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

Figure 1:
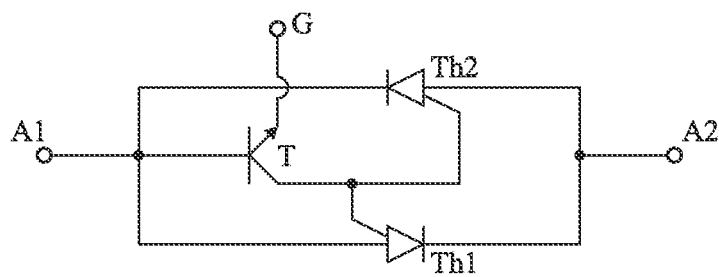
FIG. 1, previously described, is an electric diagram of an example of a bidirectional switch.

For clarity, the same elements have been designated with the same reference numerals in the various drawings and, further, as usual in the representation of integrated circuits, the various drawings are not to scale. Further, in the following description, unless otherwise indicated, terms "approximately", "substantially", "around", and "in the order of" mean "to within 20%", and terms referring to directions, such as "lateral", "upper", "lower", "topping", "vertical", etc. apply to devices arranged as illustrated in the cross-section view of FIG. 2A, it being understood that, in practice, the devices may have different directions.

Figure 2A:
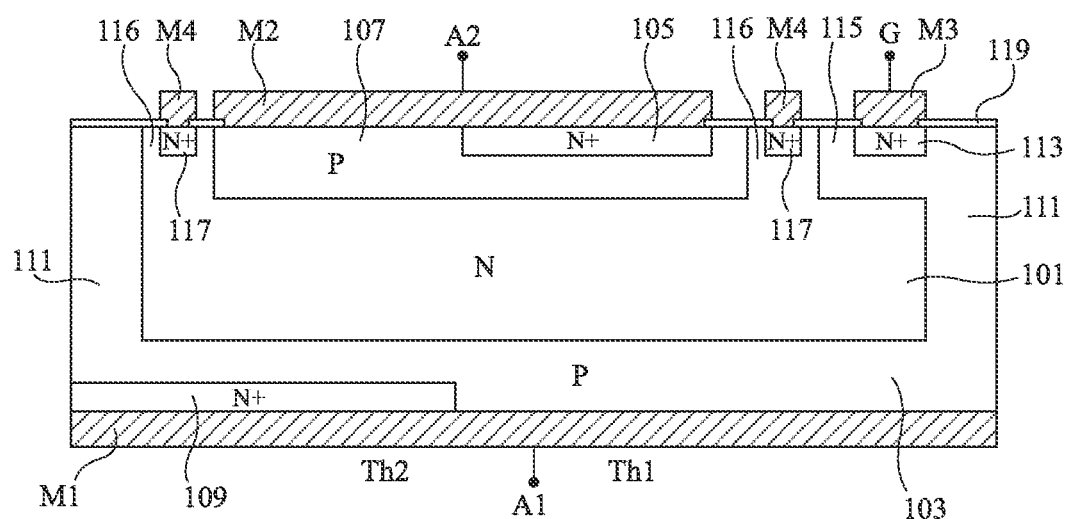
FIGS. 2A and 2B respectively are a simplified cross-section view and a simplified top view of an example of a bidirectional switch.
Figure 2B:
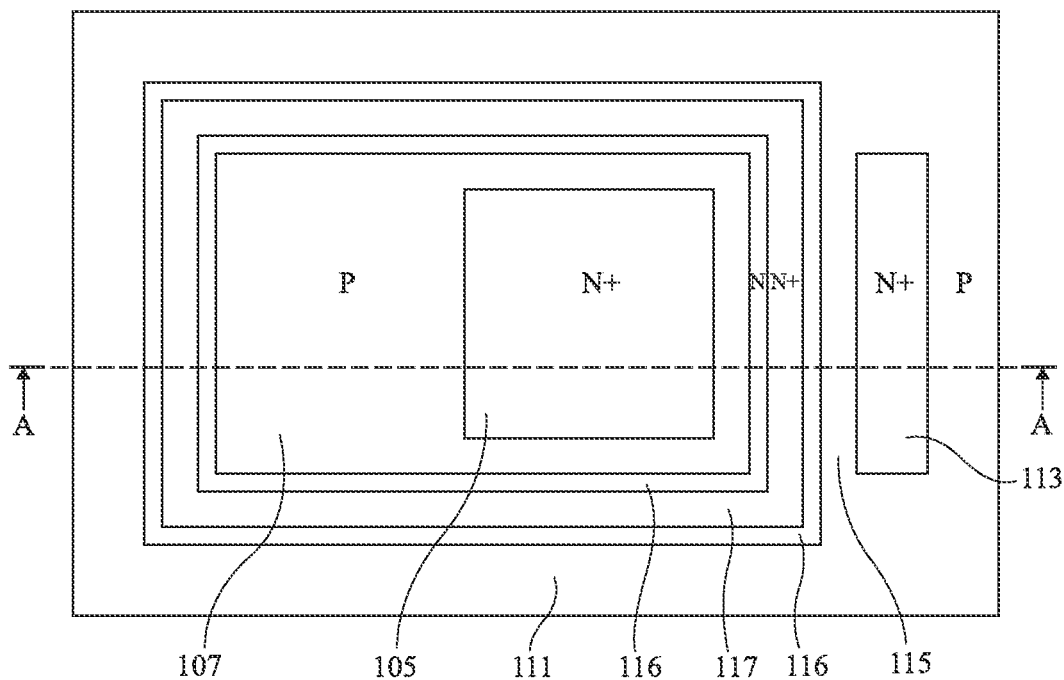

FIGS. 2A and 2B respectively are a simplified cross-section view and a simplified top view, respectively, of a monolithic embodiment of a bidirectional switch of the type described in relation with FIG. 1. FIG. 2A is a cross-section view along plane A-A of FIG. 2B. For simplification, the electrodes and the passivation layer of FIG. 2A have not been shown in the top view of FIG. 2B. Transistor T is formed in the right-hand portion of the drawings. Thyristors Th1 and Th2 are vertical thyristors, adjacent in this example, respectively located at the center and to the left of the drawings.

The structure of FIGS. 2A and 2B is formed from an N-type doped semiconductor substrate 101, for example, a silicon substrate. The anode of thyristor Th1 corresponds to a P-type doped layer 103 formed on the lower surface or rear surface side of substrate 101. In this example, layer 103 extends over substantially the entire surface of the substrate. The cathode of thyristor Th1 corresponds to an N-type doped region 105 formed on the upper surface or front surface side of the substrate, in a P-type doped well 107 formed on the front surface side. In this example, cathode region 105 of thyristor Th1 occupies a portion only of the surface of well 107, and the anode of thyristor Th2 corresponds to another portion of well 107. The cathode of thyristor Th2 corresponds to an N-type doped region 109 formed on the rear surface side in layer 103, in an area substantially complementary to that occupied by region 105. Thus, the active portion of thyristor Th1 is formed by the stacking of region 105 and of the portions of regions 107, 101, and 103 opposite region 105, and the active portion of thyristor Th2, adjacent to the active portion of thyristor Th1, is formed by the stacking of region 109 and of the portions of regions 103, 101, and 107 opposite region 109.

At its periphery, the switch comprises a P-type doped region 111 extending from the front surface of the substrate to layer 103, and forming a vertical ring-shaped wall around thyristors Th1 and Th2. Region 111 is for example obtained by drive-in from the two surfaces of the substrate. The switch gate is formed by an N-type region 113 formed, on the front surface side, in a P-type doped well 115 in contact with peripheral region 111. As a variation (not shown), region 113 may be directly formed in an upper portion of peripheral region 111. Further, as a variation (not shown), well 115 may be separated from peripheral region 111 and may be electrically connected thereto by a metallization. Further, as a variation (not shown), peripheral region 111 may be coated on its entire surface with a metallization which is not connected to an external terminal of the switch. On the front surface side, well 107, which defines, in top view, the region of where the active portions of thyristors Th1 and Th2 are formed, is separated from peripheral wall 111 and/or from well 115 by a ring-shaped region 116 of substrate 101.

On the rear surface side, a metallization M1 corresponding to first main electrode A1 of the switch coats the lower surface of region 109 and the lower surface of layer 103. On the front surface side, a metallization M2, corresponding to second main electrode A2 of the switch, coats the upper surface of region 105 and the upper surface of well 107. The upper surface of region 113 is coated with a metallization M3 corresponding to gate electrode G of the switch.

On the front surface side of the substrate, the switch further comprises, formed in the ring-shaped region of substrate 116, a ring-shaped N-type doped region 117, having a higher doping level than the substrate, surrounding (in top view) well 107. A metallization M4 may be formed on the upper surface of region 117, with no connection of metallization M4 to an external terminal of the switch.

On the front surface side, the portions of the substrate surface which are not coated with a metallization may be coated with an insulating passivation layer 119.

As a non-limiting example, substrate 101 has a doping level in the range from $10^{14}$ to $2*10^{14}$ atoms/cm$^3$, P-type doped regions 103, 107, 111, and 115 have a doping level in the range from $10^{18}$ to $10^{19}$ atoms/cm$^3$, and N-type doped regions 105, 109, 113, and 117 have a doping level in the range from $10^{19}$ to $2*10^{20}$ atoms/cm$^3$.

The bidirectional switch of FIGS. 2A and 2B operates as follows.

When electrode A2 is negative with respect to electrode A1, thyristor Th1 is likely to be turned on. If a negative voltage is applied between gate electrode G and terminal A1, the base-emitter junction of transistor T is forward biased, and the transistor turns on. A current then flows between metallization M1 and metallization M3, through layer 103 and peripheral region 111, and then into regions 101, 115, and 113 forming transistor T. Carriers are thus generated at the junction between substrate 101 and well 115, close to the junction between substrate 101 and well 107, in the vicinity of the active portion of thyristor Th1. When the carrier generation is sufficient, thyristor Th1 is set to a conduction state. Such a switch turning-on mode will be called "Q3 turning-on".

When electrode A2 is positive with respect to electrode A1, thyristor Th2 is likely to be turned on. If a negative voltage is applied between gate electrode and terminal A1, transistor T becomes conductive, and a vertical current flows, as at the Q3 turning-on, between metallization M1 and metallization M3, through layer 103 and peripheral region 111, and then into regions 101, 115, and 113 forming transistor T. N-type region 117 being relatively strongly conductive with respect to substrate 101, particularly when it is coated with a ring-shaped metallization M4, part of the electrons of the current between metallization M1 and metallization M3 flow through ring-shaped region 117/M4 and through peripheral wall 111. Carriers are thus generated at the junction between substrate 101 and peripheral wall 111, close to the junction between substrate 101 and well 107, in the vicinity of the active portion of thyristor Th2. When the carrier generation is sufficient, thyristor Th2 is set to a conduction state. Such a switch turn-on mode will be called "Q2 turning-on".

A problem which arises is that this type of switch has a control sensitivity, or turn-on sensitivity, which is different according whether the switch is turned on in Q2 or Q3, that is, the gate current necessary to turn on thyristor Th1 (Q3 turning-on) is different from the gate current necessary to turn on thyristor Th2 (Q2 turning-on). As a non-limiting illustrative example, with a structure of the type described in relation with FIGS. 2A and 2B, the inventors have observed that the gate current necessary to obtain a Q3 turning-on is approximately 2.5 times higher than the gate current necessary to obtain a Q2 turning-on.

It would be desirable to be able to further symmetrize the Q2 and Q3 turn-on sensitivities of a bidirectional switch of the type described in relation with FIGS. 1, 2A, and 2B.

There appears from the foregoing that, in the example of FIGS. 2A and 2B, ring-shaped region 117 plays a major part in the Q2 turning-on of the switch, since it enables of part of the gate current to flow in the vicinity of the active portion of thyristor Th2, thus turning on thyristor Th2. Indeed, in the example of FIGS. 2A and 2B, thyristors Th1 and Th2 are adjacent, and the gate region of thyristor 113 of the switch is located on a side of the active portion of thyristor Th1 opposite to the active portion of thyristor Th2. The distance between gate region 113 and the active portion of thyristor Th2 is thus greater than the distance between gate region 113 and the active portion of thyristor Th1. In the absence of region 117, the turning-on of thyristor Th2 would thus be particularly difficult, or even impossible.

An alternative solution to the provision of ring-shaped region 117 would be to form a second gate region on the side of thyristor Th2, this second gate being connected to region 113 by a metal track. Another solution would be to provide a single gate (as in the example of FIGS. 2A and 2B), and to place this gate substantially at the same distance from the active portion of thyristor Th1 as from the active portion of thyristor Th2. Such solutions however have other disadvantages. In particular, they increase the component surface area.

A study conducted by the inventors has enabled to show that ring-shaped region 117 has an effect on the asymmetry between the Q2 turn-on sensitivity and the Q3 turn-on sensitivity. Indeed, during the Q2 turning-on as during the Q3 turning-on, part of the electrons of the turn-on current is deviated by region 117. However, in the case of a Q2 turning-on, the electron current deviated by region 117 is necessary to turn on thyristor Th2 while in the case of a Q3 turning-on, it is a lost current, which decreases the control sensitivity of thyristor Th1.

Figure 3:
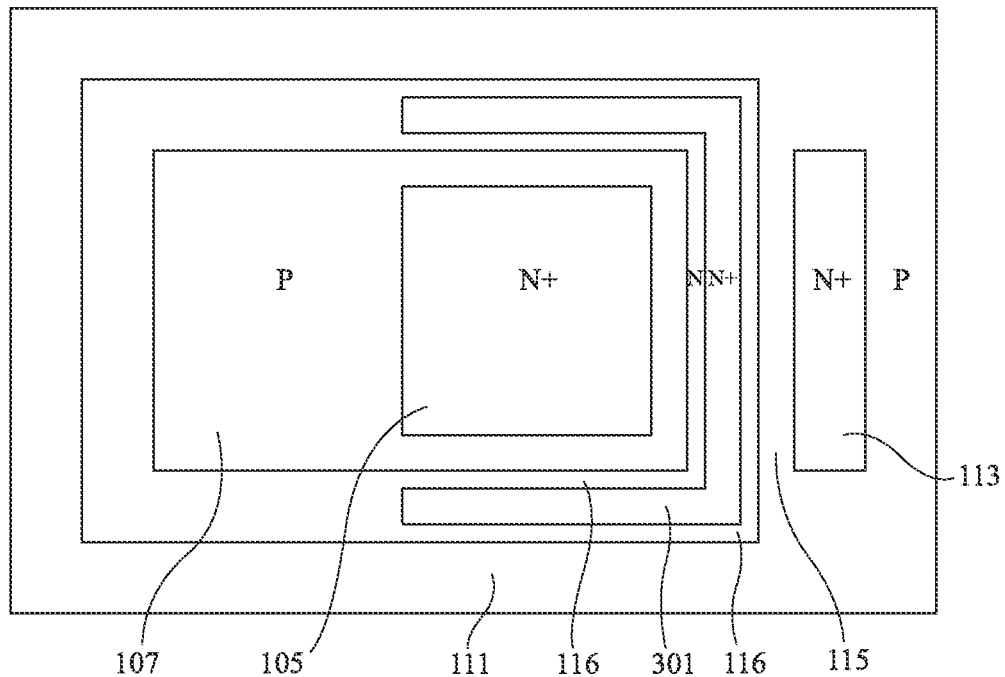
FIG. 3 is a simplified top view of an embodiment of a bidirectional switch.

FIG. 3 is a simplified top view of an embodiment of a bidirectional switch. The structure of the switch of FIG. 3 has many elements common with the structure of the switch of FIGS. 2A and 2B. These elements will not be described again in detail hereafter. Only the differences between the structure of FIG. 3 and the structure of FIGS. 2A and 2B will be detailed hereafter.

The structure of FIG. 3 differs from the structure of FIGS. 2A and 2B in that ring-shaped region 117 of the structure of FIGS. 2A and 2B is replaced with a U-shaped N-type region 301 having a higher doping level than the substrate, for example, the same doping level as region 117 of the structure of FIGS. 2A and 2B, located in ring-shaped substrate region 116 located between well 107 and peripheral wall 111 and/or well 115. Region 301 only partially surrounds well 107. More particularly, region 301 partially surrounds the portion of well 107 corresponding to the active portion of the thyristor closest to gate region 113, thyristor Th1 in the present example, and stops at the level of the adjacent region between thyristors Th1 and Th2, that is, each end of region 301 is located substantially at the same distance from the active portion of thyristor Th1 as from the active portion of thyristor Th2. In other words, in top view or in vertical projection in the plane of the front surface of the substrate, each U-shaped end is located substantially at the same distance from region 105 as from region 109. Region 301 may optionally be coated with a metallization which is not connected to an external terminal of the switch.

Tests performed by the inventors have shown that the replacing of ring-shaped region 117 of FIGS. 2A and 2B with the U-shaped region of FIG. 3 enables to significantly improve the control sensitivity of the switch in a Q3 turning-on, without significantly altering the sensitivity of the Q2 turning-on. Thus, the structure of FIG. 3 has a better turn-on sensitivity symmetry than the structure of FIGS. 2A and 2B. As a non-limiting illustrative example, with a structure of the type described in relation with FIG. 3, the inventors have observed that the gate current necessary to obtain a Q3 turning-on is only 1.3 times greater than the gate current necessary to obtain a Q2 turning-on.

Figure 4:
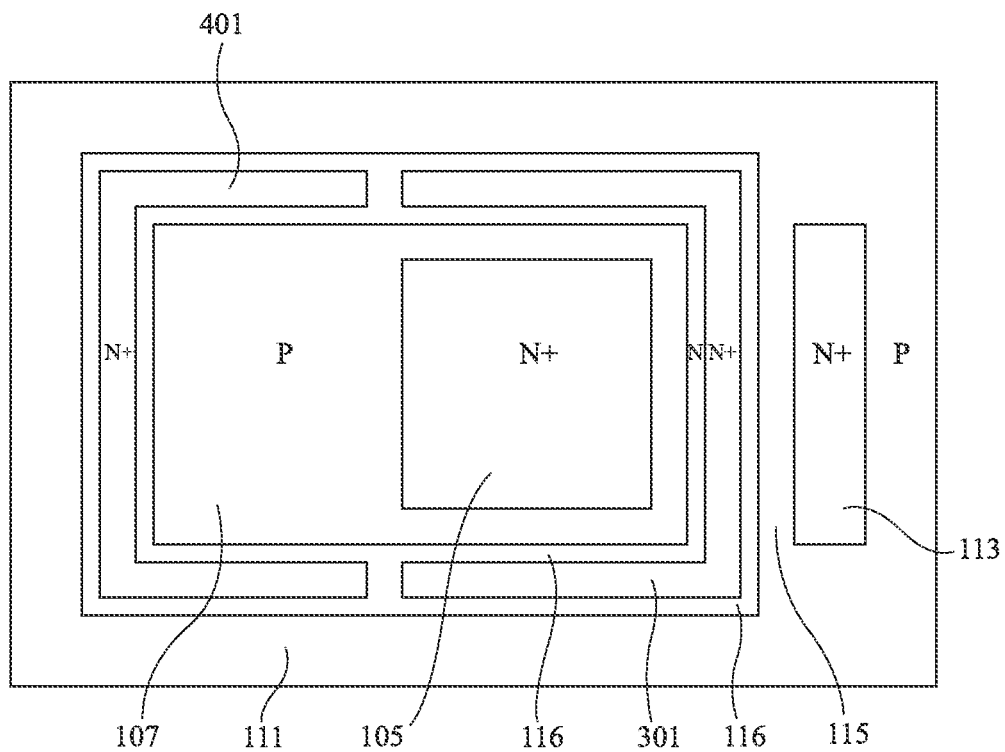
FIG. 4 is a simplified top view of an alternative embodiment of the bidirectional switch of FIG. 3.

FIG. 4 is a simplified top view of an alternative embodiment of the bidirectional switch of FIG. 3. The structure of FIG. 4 comprises the same elements as the structure of FIG. 3, and further comprises a second U-shaped N-type region 401 having a greater doping level than the substrate, for example, of same doping level as region 301, located in a ring-shaped substrate region 116 located between well 107 and peripheral wall 111 and/or well 115. Region 401 partially surrounds well 107. More particularly, region 401 partially surrounds the portion of well 107 containing the active portion of the thyristor most remote from gate region 113, thyristor Th2 in the present example, and stops at the level of the adjacent region between thyristors Th1 and Th2. Regions 301 and 401 are separate. The ends of U-shaped region 401 are directed towards the ends of U-shaped region 301, but do not touch region 301. Region 401 may optionally be coated with a metallization which is not connected to region 301 and not connected to an external terminal of the switch.

The structure of FIG. 4 has the same advantages as the structure of FIG. 3, and further enables to improve the breakdown voltage of the switch in the off state. Indeed, in the structure of FIG. 4, regions 301 and 401 form channel stop regions enabling to avoid, along almost the entire periphery of the switch, the turning-on of a PNP-type lateral parasitic transistor formed by regions 111, 101, and 107. In the structure of FIG. 3, only one half (approximately) of the switch periphery is protected against the turning-on of the lateral PNP transistor by region 301. Regions 301 and 401 thus enable to limit the impact of a possible forming of a P channel under passivation layer 119.

As a variation, in the structure of FIG. 4, region 401 may comprise one or a plurality of switches between the two ends of the U, which enables to adjust the trade-off between the sensitivity symmetry and the off-state breakdown voltage.

Specific embodiments have been described. Various alterations, modifications, and improvements will readily occur to those skilled in the art.

In particular, the active portions of adjacent thyristors Th1 and Th2 may have other shapes (in top view) than those shown in the drawings. Region 301 and/or region 401 may have other shapes that the above-mentioned U shapes, for example, C shapes, or any other ring-shaped band portion shape having its ends located at the level of the adjacent region between thyristors Th1 and Th2.

Further, various additional elements for optimizing the switch performance may optionally be provided, such as the presence of P-type short-circuit holes crossing region 109 and connecting metallization M1 to layer 103, the presence of a resistive or insulating layer between layer 103 and metallization M1 on the rear surface side of the switch, under gate region 113, other arrangements of the switch gate—for example, an arrangement of the gate in a corner of the component, etc.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

The invention claimed is:

1. A bidirectional switch, comprising:
a semiconductor substrate of a first conductivity type having a front surface and a rear surface;
first and second adjacent thyristors connected in antiparallel extending vertically between the front surface and the rear surface of the substrate;
a vertical peripheral wall of a second conductivity type connecting the front surface of the semiconductor substrate to the rear surface and surrounding said first and second adjacent thyristors;
on the front surface, in a ring-shaped region of the substrate separating the vertical peripheral wall from the first and second adjacent thyristors, a first region of the first conductivity type, having a greater doping level than the semiconductor substrate, the first region having a shape of a band at least partially surrounding the first thyristor, wherein said first region does not extend into an adjacent region between the first and second adjacent thyristors;
a second region of the first conductivity type located in a first well of the second conductivity type extending from and in contact with said vertical peripheral wall, the second region forming a gate of the bidirectional switch for actuating both the first thyristor and second thyristor.

2. The bidirectional switch of claim 1, wherein the second region is positioned further from the second thyristor than from the first thyristor and wherein said first region is positioned between the first thyristor and the vertical peripheral wall where said second region is located.

3. The bidirectional switch of claim 2, wherein the second region is located on a side of the first thyristor opposite to the second thyristor.

4. The bidirectional switch of claim 2, wherein a portion of the first region is located between the second region and the first thyristor.

5. The bidirectional switch of claim 1, wherein the shape of a band of the first region surrounds the first thyristor in top view on three sides.

6. The bidirectional switch of claim 1, wherein the first region is coated with a metallization which is not connected to an external terminal of the switch.

7. The bidirectional switch of claim 1, further comprising, on the front surface, in said ring-shaped region of the substrate, a third region of the first conductivity type, having a doping level greater than that of the substrate, the third region having the shape of a portion of a band at least partially surrounding the second thyristor, wherein said third region does not extend into the adjacent region between the first and second adjacent thyristors, and wherein ends of the bands for the third and first regions are physically separated from each other by a portion of the semiconductor substrate.

8. The bidirectional switch of claim 7, wherein the third region is coated with a metallization which is not connected to an external terminal of the switch and not connected to the first region.

9. The bidirectional switch of claim 1, comprising:
on the rear surface, a layer of the second conductivity type and a fourth region of the first conductivity type formed in said layer and extending over a first portion of the rear surface, said layer being connected to the front surface by the vertical peripheral wall;
on the front surface, a second well of the second conductivity type separated from the vertical peripheral wall by said first region, and a fifth region of the first conductivity type formed in the second well and extending over a second portion of the front surface substantially complementary to the first portion,
wherein ends of the band for the first region are located, in top view, substantially at a same distance from the fourth region as from the fifth region.

10. The bidirectional switch of claim 9, further comprising a first metallization coating the rear surface at the fourth region and the rear surface of said layer, and a second metallization coating the front surface at the fifth region and the front surface at the second well.

11. The bidirectional switch of claim 1, wherein the first and second conductivity types, respectively, are type N and type P.

12. The bidirectional switch of claim 1, wherein the band for the first region is U-shaped to surround the first thyristor in top view on three sides.

13. The bidirectional switch of claim 1, wherein the band for the first region is C-shaped to surround the first thyristor in top view on three sides.

14. A bidirectional switch, comprising:
a semiconductor substrate having a front surface and a rear surface;
a first region of a first conductivity type within the semiconductor substrate;
a peripheral wall of a second conductivity type extending from the front surface of the semiconductor substrate to the rear surface and surrounding said first region;
a layer of the second conductivity type extending along the rear surface and connected to the peripheral wall;
a second region of the second conductivity type contained within the first region and defining a ring-shaped portion of the first region separating the peripheral wall from said second region;
a third region of the first conductivity type contained within the second region;
a fourth region of the first conductivity type located in the peripheral wall;
a fifth region of the first conductivity type contained within the layer of the second conductivity type; and
on the front surface, in said ring-shaped portion, a first partial region of the first conductivity type, having a greater doping level than the semiconductor substrate, the first partial region shaped to only partially surround both the second region and the third region.

15. The bidirectional switch of claim 14, further comprising on the front surface, in said ring-shaped portion, a second partial region of the first conductivity type, having a greater doping level than the semiconductor substrate, the second partial region shaped to only partially surround the second region, wherein ends of the second partial region are physically separated from opposed ends of the first partial region by a portion within the ring-shaped portion.

16. The bidirectional switch of claim 14, wherein the first partial region is U-shaped to surround the first thyristor in plan view on three sides.

17. The bidirectional switch of claim 14, wherein the first partial region is C-shaped to surround the first thyristor in plan view on three sides.

18. The bidirectional switch of claim 14, wherein the second region, in plan view, is rectangular in shape having opposed first and second sides and having opposed third and fourth sides, wherein the first partial region is a band that extends along the first side and partially along both the third and fourth sides.

19. The bidirectional switch of claim 18, further comprising on the front surface, in said ring-shaped portion, a second partial region of the first conductivity type, having a greater doping level than the semiconductor substrate, the second partial region shaped to only partially surround the second region, wherein ends of the second partial region are physically physically separated from opposed ends of the first partial region by a portion within the ring-shaped portion.

20. The bidirectional switch of claim 19, wherein the second partial region is a band that extends along the second side and partially along both the third and fourth sides.

* * * * *